(12) United States Patent
Elsherbini et al.

(10) Patent No.: US 11,417,586 B2
(45) Date of Patent: Aug. 16, 2022

(54) THERMAL MANAGEMENT SOLUTIONS FOR SUBSTRATES IN INTEGRATED CIRCUIT PACKAGES

(71) Applicant: Intel Corporation, Santa Clara, CA (US)

(72) Inventors: Adel Elsherbini, Chandler, AZ (US); Feras Eid, Chandler, AZ (US); Johanna Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 814 days.

(21) Appl. No.: 16/141,746

(22) Filed: Sep. 25, 2018

(65) Prior Publication Data

US 2020/0098669 A1    Mar. 26, 2020

(51) Int. Cl.
| | |
|---|---|
| *H01L 23/473* | (2006.01) |
| *H01L 23/498* | (2006.01) |
| *H01L 21/48* | (2006.01) |
| *H01L 23/427* | (2006.01) |
| *H01L 25/065* | (2006.01) |
| *H01L 23/00* | (2006.01) |

(52) U.S. Cl.
CPC ........ *H01L 23/473* (2013.01); *H01L 21/4871* (2013.01); *H01L 23/427* (2013.01); *H01L 23/49827* (2013.01); *H01L 23/49838* (2013.01); *H01L 24/16* (2013.01); *H01L 25/0657* (2013.01); *H01L 2224/16225* (2013.01); *H01L 2225/06517* (2013.01); *H01L 2225/06548* (2013.01); *H01L 2225/06589* (2013.01)

(58) Field of Classification Search
CPC .......................... H01L 23/473; H01L 23/427
See application file for complete search history.

(56) References Cited

U.S. PATENT DOCUMENTS

2017/0133298 A1\* 5/2017 Gutala ................ H01L 23/3677

\* cited by examiner

*Primary Examiner* — Tucker J Wright
(74) *Attorney, Agent, or Firm* — Essential Patents Group, LLP.

(57) ABSTRACT

An integrated circuit structure may be formed having a substrate, at least one integrated circuit device embedded in and electrically attached to the substrate, and at least one heat transfer fluid conduit extending through the substrate, wherein the heat transfer fluid conduit is electrically attached to the at least one integrated circuit device. In one embodiment, the at least one heat transfer fluid conduit is a power transfer route for the at least one integrated circuit device.

8 Claims, 7 Drawing Sheets

THERMAL MANAGEMENT SOLUTIONS FOR SUBSTRATES IN INTEGRATED CIRCUIT PACKAGES

TECHNICAL FIELD

Embodiments of the present description generally relate to the removal of heat from integrated circuit packages, and, more particularly, to thermal management solutions for the substrates used to form the integrated circuit packages.

BACKGROUND

Higher performance, lower cost, increased miniaturization, and greater packaging density of integrated circuits within integrated circuit devices are ongoing goals of the electronics industry. As these goals are achieved, integrated circuit packages become smaller. These integrated circuit packages may have a variety of configurations. For example, the integrated circuit package may be a "flip chip" package, wherein integrated circuit devices are assembled on a surface of a substrate using interconnects, such as solder bumps or balls. In another example, the integrated circuit package may be an embedded package, wherein the integrated circuit devices (either active or passive) are embedded inside the substrate or a mold layer, and/or at least some of the package redistribution layers are formed directly over the integrated circuit device (e.g. the wafer level, the reconstituted wafer level, or the panel level). Regardless of the type of integrated circuit package, they can run at high temperatures due to embedded integrated circuit device (active or passive) and to self-heating of the metallization (conductive traces and conductive vias) within the substrate from electrical resistance, particularly when high power devices are used in the integrated circuit packages. The high temperatures can cause thermal damage to the materials used to form the substrate, particularly when organic materials are used, which can degrade at temperatures above about 300 degrees Celsius or if kept at extended periods of time at temperatures between about 200 and 250 degrees Celsius. The high temperatures can also cause damage or destruction to integrated circuits within the embedded integrated circuit device (active or passive).

One option to mitigate damage to the materials used to form the substrate is to use ceramic materials rather than using organic materials. Ceramic materials can support considerably higher temperature without degradation. However, they are generally significantly more expensive compared to organic materials and, generally, result in lower density than organic materials, e.g. requiring more layer for the same number of conductive routes within the substrate, as will be understood to those skilled in the art.

Another option to mitigate this thermal issue is to use integrated circuit devices having thermal throttling control that are capable of reducing their operating frequency and, thus, their power in order to operate at a lower temperature and avoid failures. However, this results in a lower overall performance.

A further option is to use metal layers within the substrate for heat dissipation. However, this is generally not sufficiently efficient due to the thinness of the metal layers compared to a traditional heat dissipation device.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
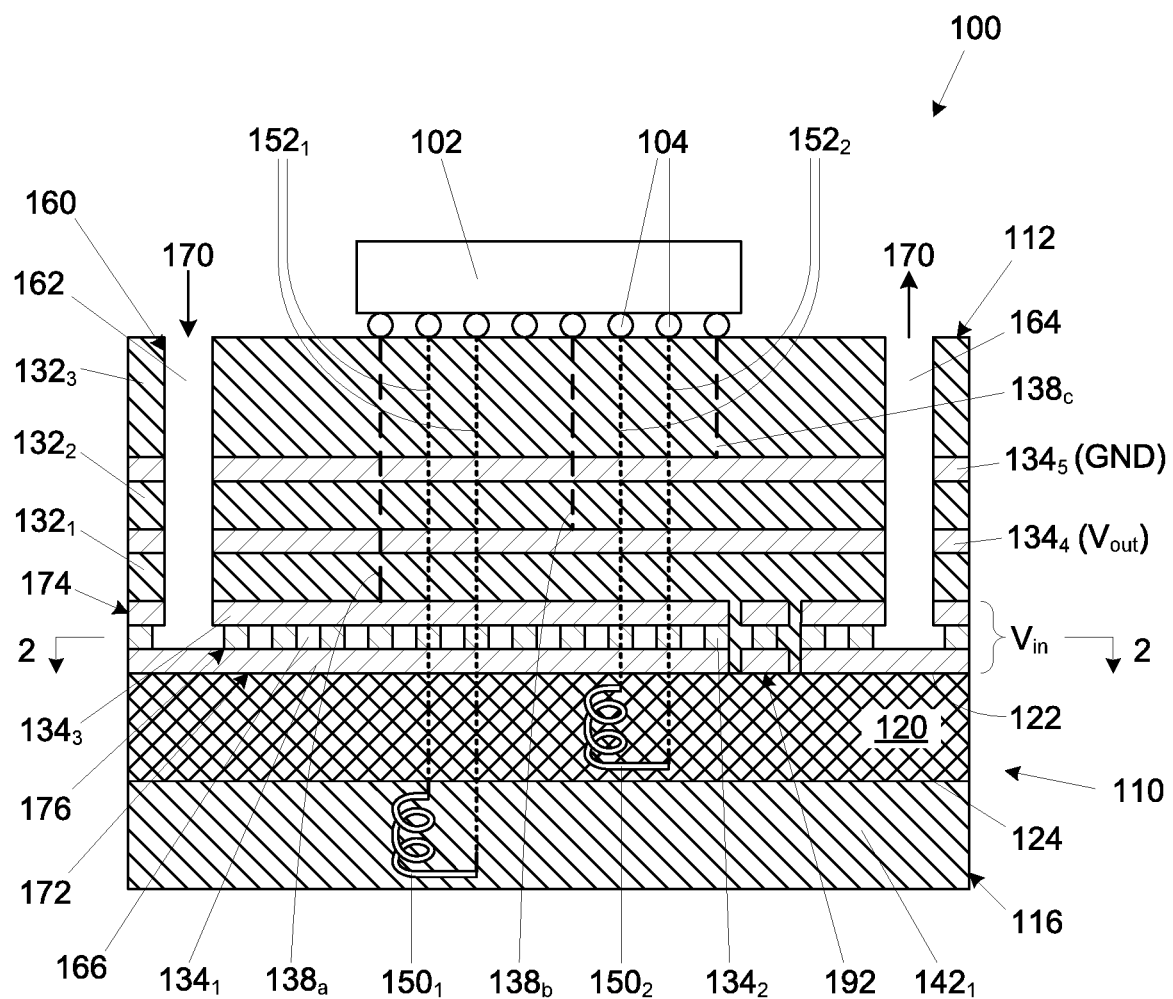
FIG. 1 is a side cross-sectional view of an integrated circuit structure having a heat transfer fluid conduit formed in a substrate, wherein the heat transfer fluid conduit is a power transfer component for integrated circuit structure, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-boned interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures. as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description may include an integrated circuit structure having a substrate, at least one integrated circuit device electrically attached to the substrate, and at least one heat transfer fluid conduit extending through the substrate, wherein the heat transfer fluid conduit is electrically attached to the at least one integrated circuit device. In one embodiment, the at least one heat transfer fluid conduit is a power transfer route for the at least one integrated circuit device.

FIG. 1 illustrates an integrated circuit package 100 having an integrated circuit device 102 electrically attached to a substrate 110, according to an embodiment of the present description. As shown in FIG. 1, the substrate 110 may be a cored substrate comprising a core 120 having a first surface 122 and an opposing second surface 124 with at least one dielectric material layer (illustrated as dielectric material layers $132_1$-$132_3$) and a plurality of electrically conductive layers $134_1$-$134_5$ formed in or on the dielectric material layers $132_1$-$132_3$, respectively, which are connected with conductive vias (not shown), formed on the first surface 122 of the core 120, and at least one dielectric material layer $142_1$ formed on the second surface 124 of the core 120. These electrically conductive layers $134_1$-$134_5$ may be referred to herein as "metallization". The processes for layering the dielectric material layers $132_1$-$132_3$ and $142_1$, and the electrically conductive layers $134_1$-$134_5$ are well known in the art and for purposes of brevity and conciseness will not be described herein.

The substrate 110 may be any appropriate structure, including, but not limited to, an interposer, a printed circuit board, a motherboard, and the like. The dielectric material layers $132_1$-$132_3$ and $142_1$ of the substrate 110 may include build-up films and/or solder resist layers, and may be composed of an appropriate dielectric material, including, but not limited to, bismaleimide triazine resin, polyimide materials, silica filled epoxy, and the like, as well as laminates or multiple layers thereof. The core 120 of the substrate 110 may be any appropriate substantially rigid material, including, but not limited to, fire retardant grade 4 material, glass reinforced epoxy matrix material, glass, ceramics, and the like. The metallization, e.g. the electrically conductive layers $134_1$-$134_5$ and the conductive vias (not shown) may be composed of any conductive material, including but not limited to metals, such as copper, aluminum, and alloys thereof. As will be understood to those skilled in the art, the substrate 110 may be a coreless substrate.

In one embodiment, the integrated circuit device 102 may be electrically attached to the substrate with a plurality of interconnects 104. In one embodiment, the interconnects 104 may extend between bond pads (not shown) on the integrated circuit device 102, which are in electrical communication with integrated circuitry (not shown) within the integrated circuit device 102, and bond pads (not shown) on the substrate 110, which are in contact with conductive routes 138a, 138b, 138c, $152_1$, and $152_2$, which are illustrated as dashed lines (e.g. large dashes for 138a, 138b, and 138c, and small dashes for $152_1$, and $152_2$). As will be understood to those skilled in the art, the conductive routes 138a, 138b, 138c, $152_1$, and $152_2$, may be a combination of conductive traces (not shown) and conductive vias (not shown) extending through the various dielectric layers. These conductive traces and conductive vias are well known in the art and are not shown for purposes of clarity for the drawing. The integrated circuit device 102 may be any appropriate device, including, but not limited to a microprocessor, a chipset, a graphics device, a wireless device, a memory device, an application specific integrated circuit, combinations thereof, stacks thereof, or the like. The interconnects 104 may be any appropriate electrically conductive material, including, but not limited to metal filled epoxies and solders, such as tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys).

The substrate 110 may include components that generate significant heat, such as a first inductor $150_1$ and a second inductor $150_2$. Inductors are passive two-terminal electrical devices that store energy in a magnetic field when electrical current flows through it and are used to store an electrical charge. Inductors are generally a portion of a voltage regulator circuit, which precisely controls the voltage and current of the integrated circuit device 102. In one embodiment, the first inductor $150_1$ may be formed proximate the second surface 124 of the core 120, such as in dielectric material layer $142_1$. The first inductor $150_1$ may be attached to the integrated circuit device 102 through conductive routes $152_1$. In another embodiment, the second inductor $150_2$ may be formed in the core 120. The second inductor $150_2$ may be attached to the integrated circuit device 102 through conductive routes $152_2$. In a further embodiment, the inductors $150_1$ and $150_2$ may be formed separately and embedded in the substrate 110. In still a further embodiment, the inductors $150_1$ and $150_2$ may be formed as a part of the substrate 110 during the fabrication thereof using the conductive traces (not shown) and conductive vias (not shown).

As shown in FIG. 1, the substrate 110 may include a heat transfer fluid conduit 160, which may comprise at least one inlet port 162, at least one outlet port 164, and at least one fluid channel 166 connecting the at least one inlet port 162 and the at least one outlet port 164. As shown, the at least one inlet port 162 extends from a first surface 112 of the substrate 110 through the dielectric material layers (i.e. dielectric material layers $132_1$, $132_2$, and $132_3$) and the electrically conductive layers (i.e. electrically conductive layers $134_1$, $134_2$, and $134_3$) to the at least one fluid channel 166. A heat transfer fluid 170 (illustrated generically as a down arrow (left side) and an up arrow (right side)), which may be used to remove heat from the substrate 110, may flow into the at least one fluid channel 166 through the at least one inlet port 162 and out of the fluid channel 166 through the at least one outlet port 164. In one embodiment, the heat transfer fluid conduit 160 may be adjacent or abut the core 120 of the substrate 110. In other embodiment, the heat transfer fluid conduit 160 may be coated with material during or after the package fabrication to prevent or reduce the heat transfer fluid 170 ingress into the dielectric material layers $132_1$, $132_2$, and $132_3$, and/or for corrosion resistance of the electrically conductive layers $134_1$-$134_5$ to the heat transfer fluid 170. The coating (not shown) may be any appropriate material such as a poly(p-xylylene) polymer, which may be deposited through a wet immersion process, chemical vapor deposition or physical vapor deposition process.

The heat transfer fluid 170 may be any appropriate gas or liquid, or a combination thereof. In one embodiment, the heat transfer fluid 170 may comprise water. In another embodiment, the heat transfer fluid 170 may comprise water with additional anti-corrosion additives. In still another embodiment, the heat transfer fluid 170 may comprise a dielectric refrigerant. In a further embodiment, the heat transfer fluid 170 may comprise an oil. In other embodiments, the heat transfer fluid 170 may be comprised of two phases (such as liquid water and water vapor, or liquid-phase and gas-phase dielectric refrigerant) that exist simultaneously in one or more regions of the heat transfer fluid conduit 160.

The at least one fluid channel 166 may comprise a bottom layer 172 fabricated from electrically conductive layer $134_1$, a top layer 174 fabricated from electrically conductive layer $134_3$, and at least one electrically conductive structure 176 fabricated from electrically conductive layer $134_2$ and extending between the bottom layer 172 and the top layer 174. In one embodiment, the electrically conductive structures 176 can act as shorting vias between the top layer 174 and the bottom layer 172. In another embodiment, the electrically conductive structures 176 can act as support structures between the top layer 174 and the bottom layer 172 to prevent the collapse of the fluid channel 166 during the fabrication of the substrate 110. In further embodiments, the electrically conductive structures 176 may be any appropriate structure, such as pillars, columns, pins, walls, or the like.

In one embodiment, the bottom layer 172, the top layer 174, and the electrically conductive structures 176 may be patterned to form an electrically isolated conductive via 192, as will be discussed. The electrically isolated conductive via 192 may allowed for electrical signals to be transmitted through the fluid channel 166. In a further embodiment, a sealing structure 178 may be formed from electrically conductive layer $134_2$ proximate an edge 116 of the substrate 110 to contain the heat transfer fluid 170 within the heat transfer fluid conduit 160.

As will be understood to those skilled in the art, the combination of the bottom layer 172, the top layer 174, the electrically conductive structures 176, and the sealing structure 178 contains a relatively large volume of electrically conductive material and, thus, can be used as a power transfer route or structure (e.g. power plane, power corridor, power inductor, and the like) that can transfer power signals, such as a voltage input, a voltage output, ground, or the like. As such, it may be in electrical communication with the integrated circuit device 102 through conductive route 138a. In one embodiment, the heat transfer fluid conduit 160 may transmit the voltage input ($V_{in}$) for the integrated circuit device 102. In a further embodiment, electrically conductive layer $134_2$ may be in electrical communication with the integrated circuit device 102 through conductive route 138b and may transmit the voltage output (Vout). In a further embodiment, electrically conductive layer $134_1$ may be in electrical communication with the integrated circuit device 102 through conductive route 138c and may be the ground plane (GND). It is further understood that the volume of the heat transfer fluid conduit 160 should be designed to be large enough, according to the viscosity of the heat transfer fluid 170, such that the channel flow resistance is relatively small and not require excessive pressures that may compromise the reliability of the substrate 110 or require the use of expensive and/or high-power pumps.

Figure 2:
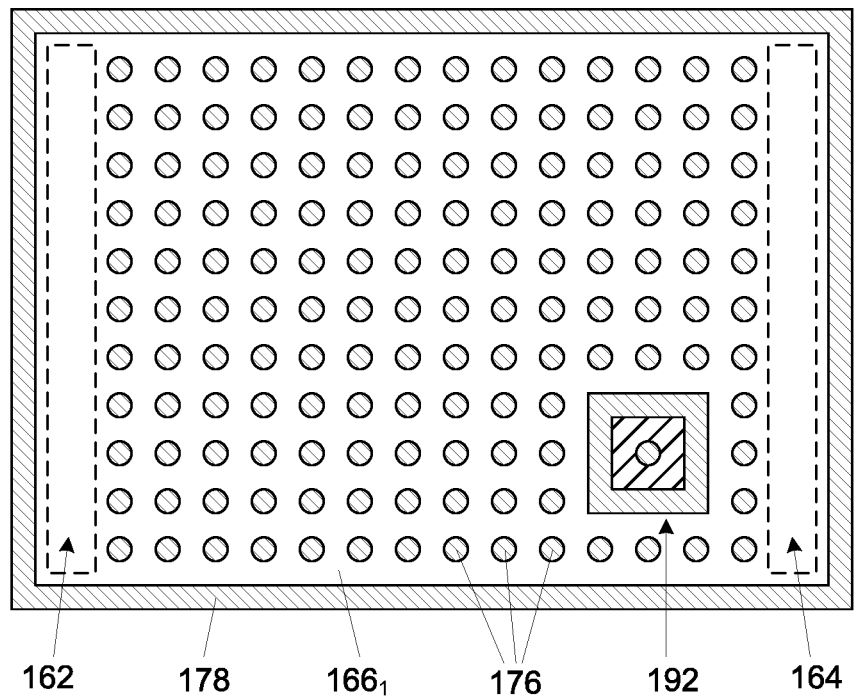
FIGS. 2 and 3 are partial cross-sectional views of a fluid channel of the heat transfer fluid conduit along line 2-2 of FIG. 1, according to one embodiment of the present description.
Figure 3:
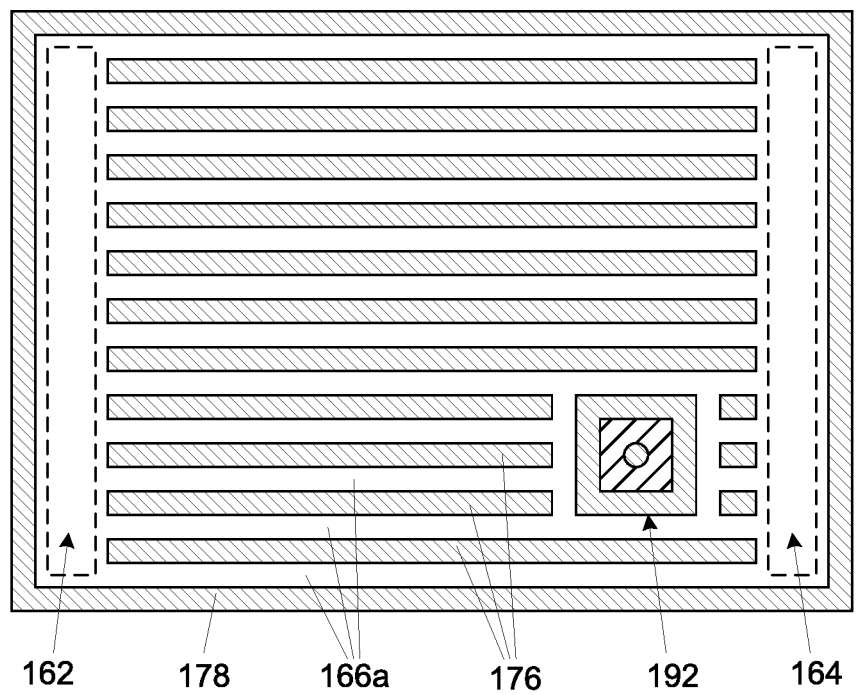

The fluid channel 166 may have any appropriate configuration. In one embodiment shown in FIG. 2, which is a view along line 2-2 of FIG. 1, the fluid channel 166 (see FIG. 1) may be a single chamber $166_1$ with the plurality of columnar-shaped, electrically conductive structures 176 disposed therein and the sealing structure 178 surrounding the electrically conductive structures 176. For clarity, the inlet port 162 and the outlet port 164 are shown in dashed lines. In another embodiment shown in FIG. 3, the electrically conductive structures 176 may be wall-shaped structures that are aligned in parallel, such that the fluid channel 166 (see FIG. 1) comprises a plurality of discrete channels (for example discrete channels 166a).

Figure 4:
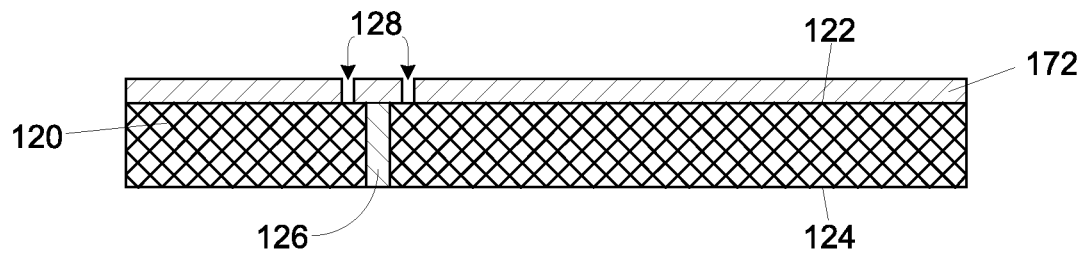
FIGS. 4-11 are side cross-sectional views of a method of fabricating an integrated circuit structure having a heat transfer fluid conduit formed in a substrate, wherein the heat transfer conduit is a power transfer component for integrated circuit structure, according to one embodiment of the present description.
Figure 5:
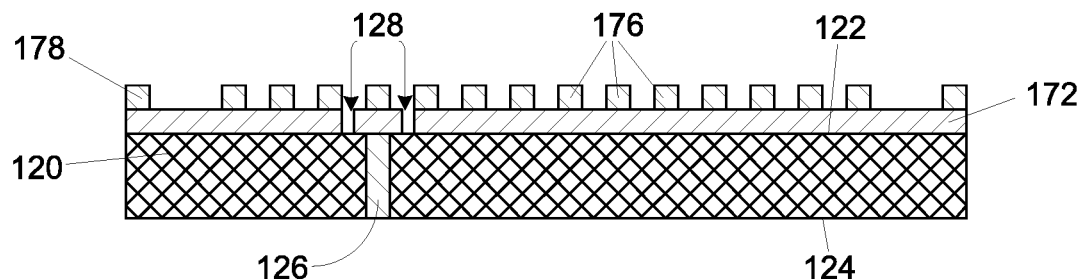
Figure 6:
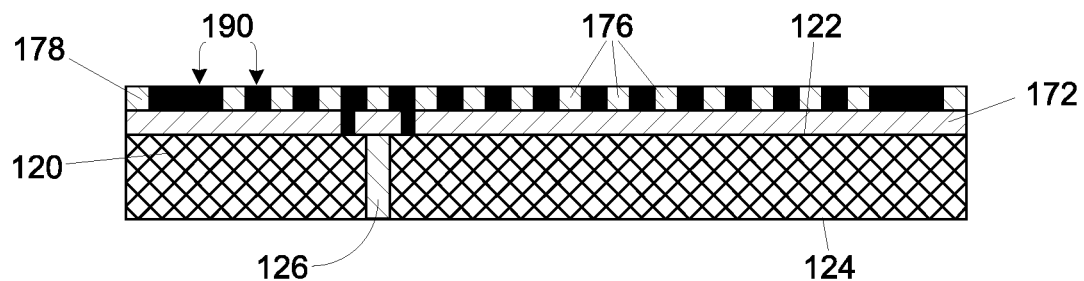

FIGS. 4-11 illustrate a method of fabricating the substrate 110 having the heat transfer fluid conduit 160, according to an embodiment of the present description. As shown in FIG. 4, the core 120 may be provided having a conductive via 126, such as a plated through-hole, extending from the first surface 122 of the core 120 to the second surface 124 of the core 120. The bottom layer 172 may be patterned on the first surface 122 of the core 120 such as by known lithography processes, which can allow for the creation any desired shape (perforated plane, power corridor, thick power trace, and the like). A first opening 128 may be formed in the bottom layer 172 to ultimately form the electrically isolated conductive via 192 (shown in FIG. 1). As shown in FIG. 5, the electrically conductive structures 176, and the sealing structure 178 may be formed on the bottom layer 172, such as by plating using a lithographic process. As shown in FIG. 6, a sacrificial material 190 may be formed, such as by lamination or molding, over the bottom layer 172 and the electrically conductive structures 176. The sacrificial material 190 may be planarized, such as by grinding, to expose the electrically conductive structures 176.

Figure 7:
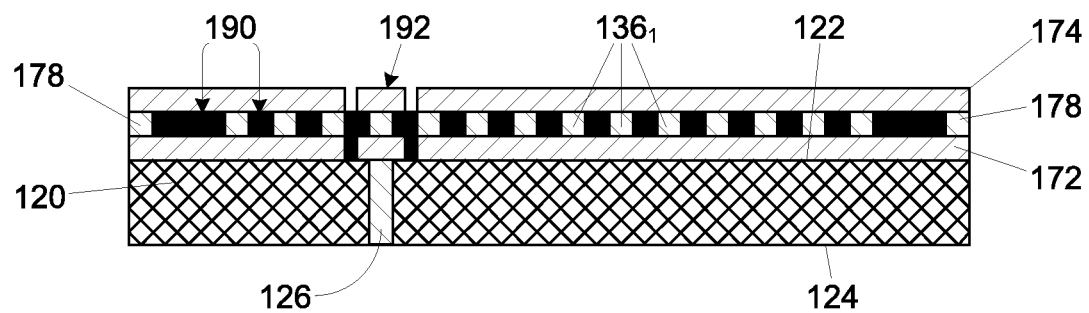

As shown in FIG. 7, the top layer 174 may be formed on the sacrificial material 190 and in electrical contact with the electrically conductive structures 176. The top layer 174 may be patterned such that the electrically isolated conductive via 192 is formed. The top layer 174 may also have holes (not shown) therethrough to allow for the subsequent removal of the sacrificial material 190. In one embodiment, the top layer 174 may be a mesh layer to facilitate the subsequent removal of the sacrificial material 190.

Figure 8:
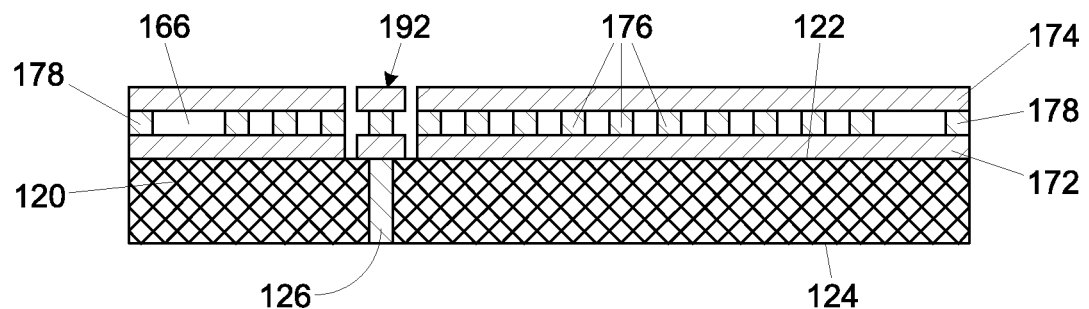

As shown in FIG. 8, the sacrificial material 190 may be removed, such as through a wet etching process, dry etching process (e.g. Reactive Ion Etch) or thermal decomposition (e.g. turning the sacrificial material 190 into a gas phase above a certain temperature).

Figure 9:
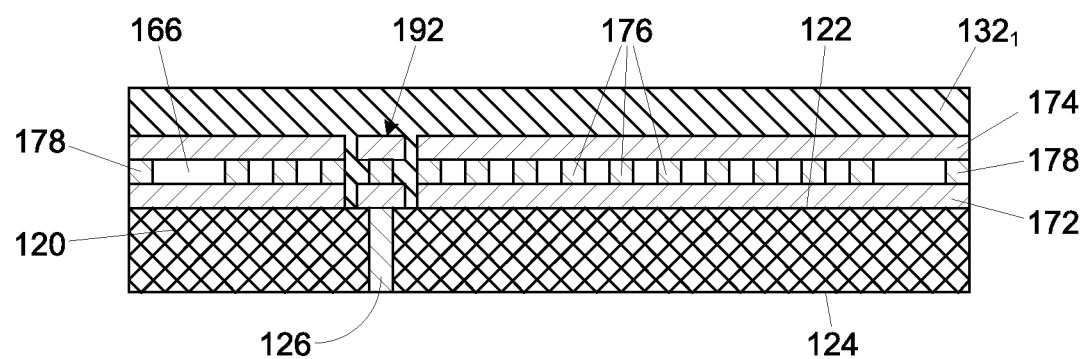
Figure 10:
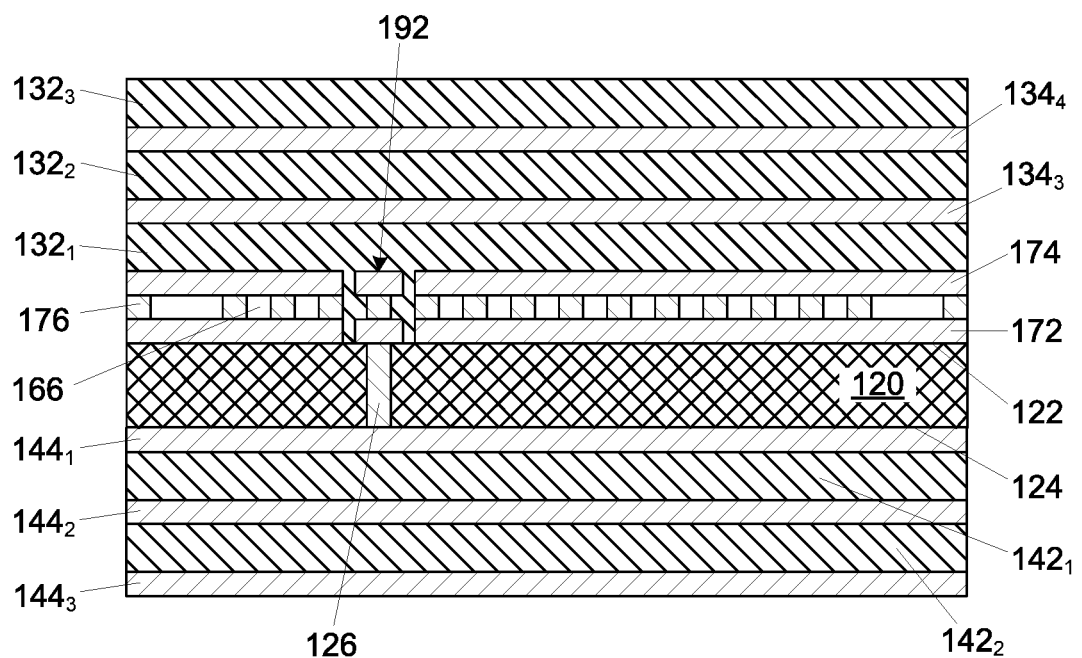
Figure 11:
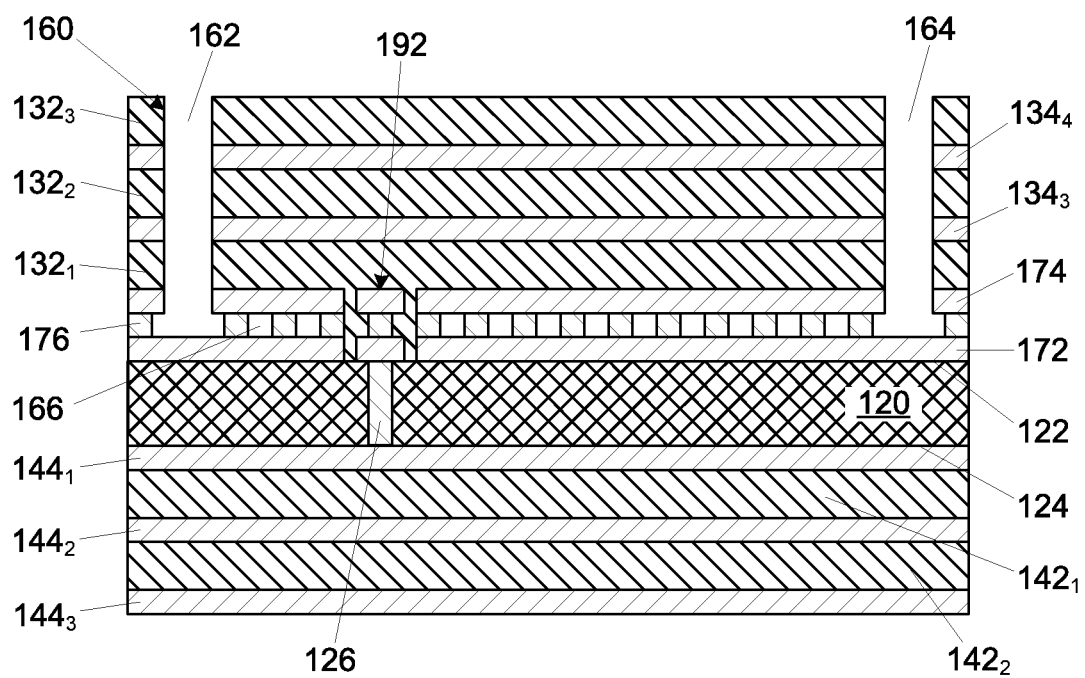

As shown in FIG. 9, dielectric material layer $132_1$ may be disposed over the top layer 174 and around the electrically isolated conductive via 192. As shown in FIG. 10, dielectric material layers $132_2$, and $132_3$, and the electrically conductive layers $134_3$ and $134_4$ may be layered on the top layer 174 of the fluid channel 166, and dielectric material layers $142_1$ and $142_2$, and $132_3$ and electrically conductive layers $144_1$, $144_2$, and $144_3$) on the first surface 124 of the core 120. It is understood that a variety of conductive routes, vias, and traces can be formed and integrated circuit devices may be embedded in this step. As shown in FIG. 11, the inlet port 162 and the outlet port 164 may be formed, such as by mechanical or laser drilling, through the dielectric material layers $132_1$, $132_2$, and $132_3$, the electrically conductive layers $134_3$ and $134_4$, and the top layer 174 of the fluid channel 166 to form the heat transfer fluid conduit 160.

Figure 12:
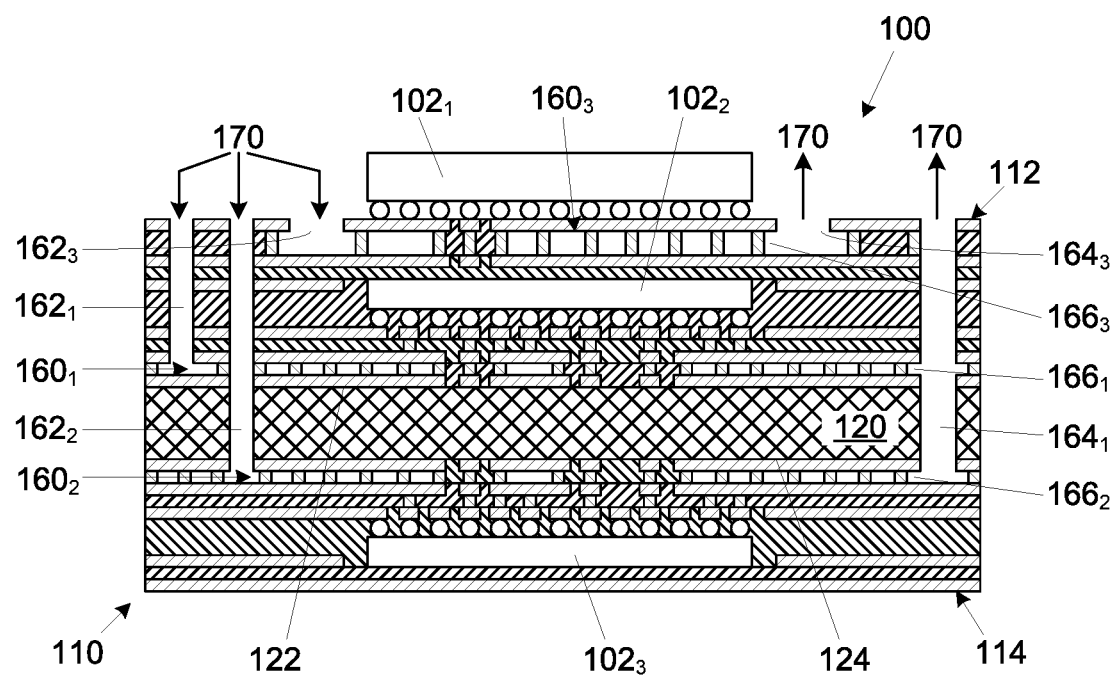
FIG. 12 is a side cross-sectional view of an integrated circuit structure having embedded integrated circuit devices and multiple heat transfer fluid conduits in the substrate, according to an embodiment of the present description.

Although FIG. 1-11 illustrate a single integrated circuit device and/or a single heat transfer fluid conduit, the embodiments of the present description are not so limited. As shown in FIG. 12, the integrated circuit package 100 may have a plurality of integrated circuit devices $102_1$, $102_2$, and $102_3$. In one embodiment, integrated circuit devices $102_1$ and $102_2$ may be embedded in the substrate 110 on opposing sides of the core 120. For the purposes of the present description, the term "embedded" is defined to mean that the integrated circuit device 102 is positioned between the first surface 112 of the substrate 110 and a second surface 114 of the substrate 110.

In another embodiment, as shown also shown in FIG. 12, the integrated circuit package 100 may have a plurality of heat transfer fluid conduits, i.e. a first heat transfer fluid conduit $160_1$, a second heat transfer fluid conduit $160_2$, and a third heat transfer fluid conduit $160_3$, in different positions within the substrate 110. Additionally, the heat transfer fluid conduits $160_1$, $160_2$, $160_3$ may have multiple inlet ports $162_1$, $162_2$, $162_3$ and outlet ports $164_1$, $164_2$, $164_3$. Furthermore, the heat transfer fluid conduits $160_1$, $160_2$, $160_3$ may share inlet ports and/or outlet ports (in parallel) to simplify the distribution of the heat transfer fluid 170. For example, as shown in FIG. 12, the first heat transfer fluid conduits $160_1$ and second heat transfer fluid conduit $160_2$ share the outlet port $164_1$.

Figure 13:
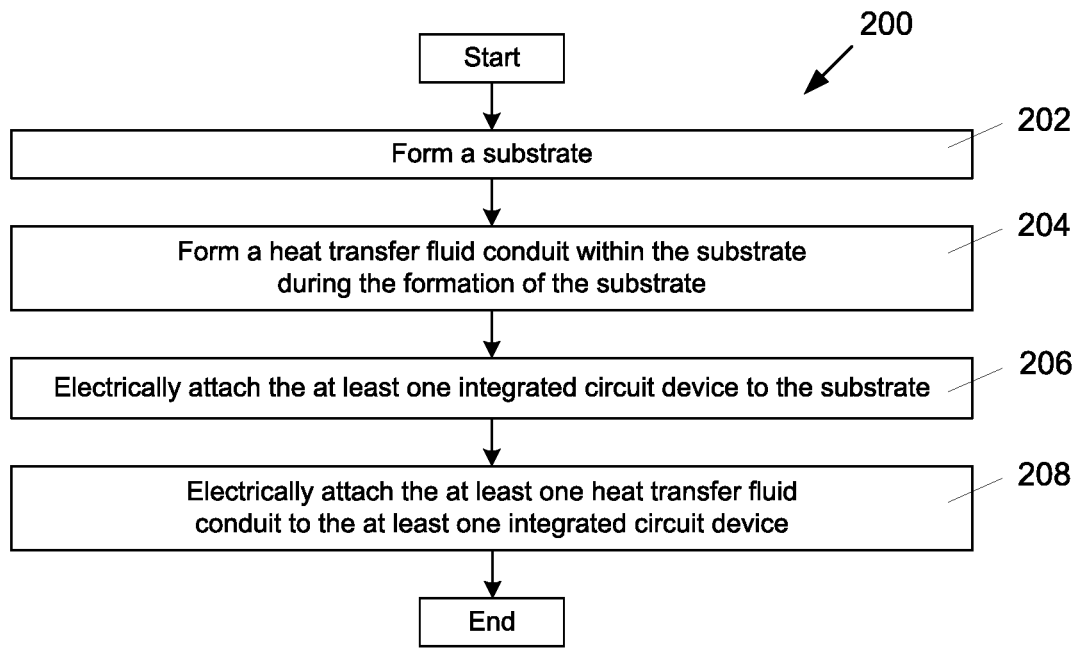
FIG. 13 is a flow diagram of a method of fabricating an integrated circuit structure, according to one embodiment of the present description.

FIG. 13 is a flow chart of a process 200 of fabricating an integrated circuit structure according to an embodiment of the present description. As set forth in block 202, a substrate may be formed. A heat transfer fluid conduit within the substrate during the formation of the substrate, as set forth in block 204. As set forth in block 206, at least one integrated circuit device may be electrically attached the substrate. The at least one heat transfer fluid conduit may be electrically attached to the at least one integrated circuit device, as set forth in block 208.

Figure 14:
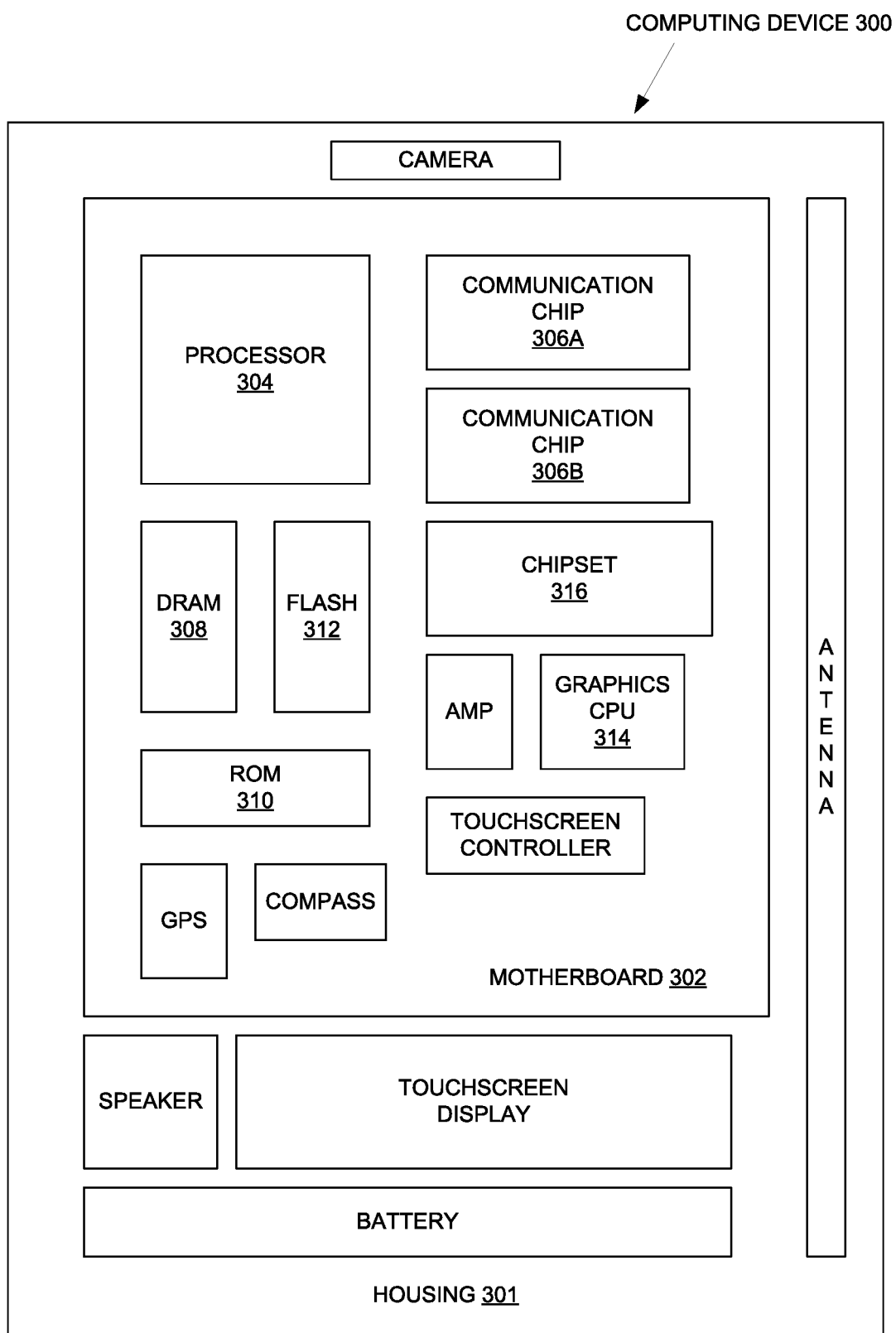
FIG. 14 is an electronic device/system, according to an embodiment of the present description.

FIG. 14 illustrates an electronic or computing device 300 in accordance with one implementation of the present description. The computing device 300 may include a housing 301 having a board 302 disposed therein. The board 302 may include a number of integrated circuit components, including but not limited to a processor 304, at least one communication chip 306A, 306B, volatile memory 308 (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 302. In some implementations, at least one of the integrated circuit components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit structure comprising a substrate, at least one integrated circuit device electrically attached to the substrate, and at least one heat transfer fluid conduit extending through the substrate, wherein the heat transfer fluid conduit is electrically attached to the at least one integrated circuit device.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-14. The subject matter may be applied to other integrated circuit devices and assembly applications, as well as any appropriate electronic application, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof

What is claimed is:

1. An integrated circuit assembly, comprising:
a substrate;
at least one integrated circuit device electrically attached to the substrate; and
at least one heat transfer fluid conduit extending through the substrate, wherein the heat transfer fluid conduit is electrically attached to the at least one integrated circuit device, wherein the at least one heat transfer fluid conduit comprises at least one inlet port, at least one outlet port, and at least one fluid channel extending between the at least one inlet port and the at least one outlet port and wherein the at least one fluid channel comprises a top layer and a bottom layer and at least one electrically conductive structure extending between and electrically connecting the top layer and the bottom layer.

2. The integrated circuit assembly of claim 1, wherein the at least one heat transfer fluid conduit is a power transfer route for the at least one integrated circuit device.

3. The integrated circuit assembly of claim 1, further comprising an electrically isolated conductive via extending through the heat transfer fluid conduit.

4. The integrated circuit assembly of claim 1, further comprising a core within the substrate.

5. An electronic system, comprising: a board; an integrated circuit package electrically attached to a substrate, wherein the integrated circuit package comprises at least one integrated circuit device electrically attached to the substrate, and at least one heat transfer fluid conduit extending through the substrate, wherein the heat transfer fluid conduit is electrically attached to the at least one integrated circuit device, wherein the at least one heat transfer fluid conduit comprises at least one inlet port, at least one outlet port, and at least one fluid channel extending between the at least one inlet port and the at least one outlet port, and wherein the at least one fluid channel comprises a top layer and a bottom layer and at least one electrically conductive structure extending between and electrically connecting the top layer and the bottom layer.

6. The electronic system of claim 5, wherein the at least one heat transfer fluid conduit is a power transfer route for the at least one integrated circuit device.

7. The electronic system of claim 5, further comprising an electrically isolated conductive via extending through the heat transfer fluid conduit.

8. The electronic system of claim 5, further comprising a core within the substrate.

\* \* \* \* \*